United States Patent [19]

Nagase et al.

[11] 3,972,756

[45] Aug. 3, 1976

[54] METHOD OF PRODUCING MIS STRUCTURE

[75] Inventors: Akira Nagase; Masayasu Tsunematsu, both of Kodaira; Norio Anzai, Tokorozawa; Akihiro Tomozawa, Kodaira, all of Japan

[73] Assignee: Hitachi, Ltd., Japan

[22] Filed: Sept. 26, 1973

[21] Appl. No.: 400,924

[30] Foreign Application Priority Data

Sept. 27, 1972 Japan.............................. 47-96157

[52] U.S. Cl................................... 156/17; 29/571; 148/187; 156/11; 156/13; 357/22; 357/23; 427/88
[51] Int. Cl.²............................................ H01L 7/50
[58] Field of Search ................ 156/3, 8, 11, 13, 17; 148/187; 29/571; 117/212; 317/235; 427/82, 85, 86, 88, 91, 93, 95; 357/22, 23, 59, 5 B

[56] References Cited
UNITED STATES PATENTS

| | | |
|---|---|---|
| 3,474,310 | 10/1969 | Ono et al............................. 317/235 |
| 3,475,234 | 10/1969 | Kerwin et al. ....................... 148/187 |
| 3,646,665 | 3/1972 | Kim ............................... 148/187 X |
| 3,700,508 | 10/1972 | Keen....................................... 156/3 |

*Primary Examiner*—William A. Powell
*Attorney, Agent, or Firm*—Craig & Antonelli

[57] ABSTRACT

A method of producing an MIS structure having self-alignment construction, wherein an insulating film is formed on the surface of a semiconductor substrate, a semiconductor layer is formed on a selected area of the insulating film, parts of the insulating film are etched using the semiconductor layer as a mask, and the surface of the semiconductor layer is etched in such manner that the underlying insulating film may not be etched, whereby the marginal portion of the semiconductor layer which otherwise projects laterally beyond the underlying insulating film is caused to recede.

6 Claims, 8 Drawing Figures

I. NO COUNTER MEASURE

II. PENT ROOF ETCHING BEFORE DIFFUSION OF SOURCE AND DRAIN

III. LIGHT OXIDATION

IV. PENT ROOF ETCHING AND LIGHT OXIDATION BEFORE DIFFUSION SOURCE AND DRAIN

V. PENT ROOF ETCHING AND LIGHT OXIDATION AFTER DIFFUSION OF SOURCE AND DRAIN

METHOD OF PRODUCING MIS STRUCTURE

BACKGROUND OF THE INVENTION

1. Field of the Invention

The present invention relates to a method of producing a MIS structure such as a silicon gate MIS field-effect transistor.

2. Description of the Prior Art

In general, in an MIS field-effect transistor having an insulated gate portion, the insulating film of the gate is formed to be extremely thin, approximately 1,000 A, because of required characteristics. Moreover, the gate capacitance is several pF or less and is extremely small. Therefore, the gate is sometimes destroyed even by, for example, slight static electricity which is undesirably impressed during handling. There has hitherto been known a method in which, in order to avoid such destruction of the gate, a protective diode, adapted to break down by voltages above a predetermined threshold, is connected between the gate and the substrate of the transistor or between a resistance incorporated in series with the gate and the substrate, thus preventing any voltage above a gate-destroying voltage from being applied to the gate portion.

Similar gate destruction may also occur in a silicon gate MIS transistor which uses polycrystalline silicon for its gate. It is, accordingly, more desirable that the diode also be used in the silicon gate MIS transistor so as to prevent any abnormal voltage from being applied to the gate. Even with the protective method, however, the destruction of the gates has often occured in silicon gate MIS transistors. In order to clarify the cause, the inventors performed a test in which elements where are likely to cause gate destruction were particularly selected by the use of the voltage screening method. "The voltage screening method" is a procedure which is carried out before the final test and in which an MIS-LSI is operated for 5 minutes with its operating voltage held higher by 20 percent. As a result, it was effectively ensured that the gate destruction would be generated at a marginal part of the silicon gate. Upon study of the defects, it was determined that the defects are associated with the method by which the silicon gate MIS transistors are produced. Upon further study, the cause of the defects was inferred as explained below.

A silicon gate MIS transistor employs the so-called self-alignment construction by which an oxide film is first formed on a semiconductor substrate, a silicon layer is formed on the oxide film, the gate portion is selectively formed in the silicon layer, the oxide film is selectively etched using the silicon layer as a mask, and impurities are introduced into the surface of the semiconductor substrate using the gate portion as a mask and in order to form the source and drain. In this case, however, the side face of the oxide film 3a is side-etched as shown in FIG. 3 of the drawings during the etching of the gate oxide film, so that the marginal portion of the polycrystalline silicon layer 4a protrudes in the form of an acute-angled "pent roof" 4c. Such pent roof 4c sometimes hangs down onto the side of the source or drain 6 at a part of its marginal portion. In addition, during the deposition and formation of the oxide film 7, shortcomings such as dirt are liable to gather in the insulator layer 3a under the pent roof. As a consequence, a concentration of the electric field takes place at this part.

Then, a countermeasure has been taken with a method in which the surface portion of the polycrystalline silicon was lightly oxidized to make the pent roof 4c small. Even with such a method, however, the generation of some voltage screening defects was still unavoidable.

The present invention is provided to prevent the gate destruction in such way that the foregoing pent roof portion of the polycrystalline silicon is perfectly removed by etching.

SUMMARY OF THE INVENTION

An object of the present invention is to prevent the destruction of a gate in a silicon gate MIS semiconductor device.

The fundamental construction of the present invention for accomplishing the above-mentioned object is characterized, in a method of producing a MIS structure, by the steps of forming an insulating film on the surface of a semiconductor substrate and forming a semiconductor layer partially on the insulating film, partially etching the insulating film with the semiconductor layer used as a mask, and etching the surface of the semiconductor layer so as not to etch the insulating film.

Another construction of the present invention is characterized in a method of producing a silicon gate MIS field-effect transistor in which an oxide film is thermally formed on a silicon substrate. A polycrystalline silicon layer is formed on the oxide film and parts of the oxide film and the polycrystalline silicon layer are etched to form a gate and simultaneously expose parts of the substrate. Impurities are then doped into the substrate with the gate used as a mask, to thereby form a source and a drain. The surface of the polycrystalline silicon layer is etched after the gate formation or the impurity doping by the use of a liquid etchant whose etching rate is larger for the polycrystalline silicon layer than for the oxide film.

PREFERRED EMBODIMENTS OF THE INVENTION

Figure 1A:
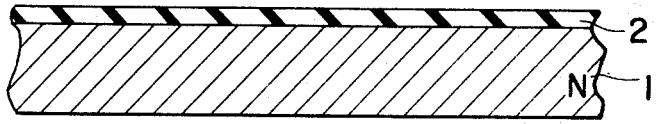
FIGS. 1a to 1j are views showing various steps of the method of producing a MIS structure according to an embodiment of the present invention.
Figure 1B:
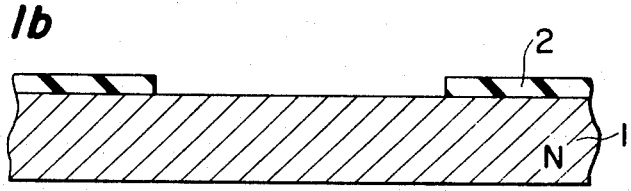
Figure 1C:
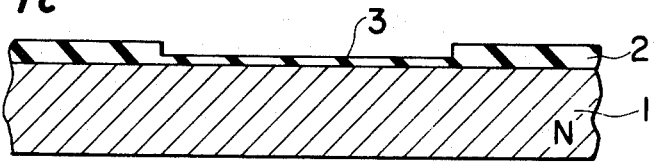
Figure 1D:
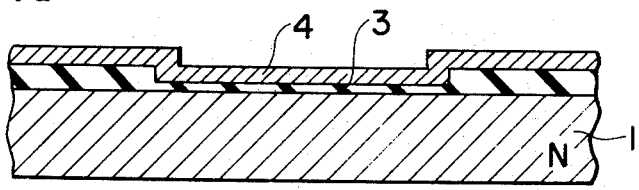
Figure 1E:
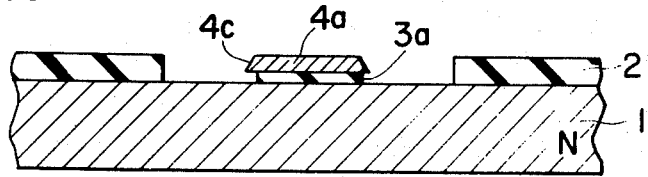
Figure 1F:
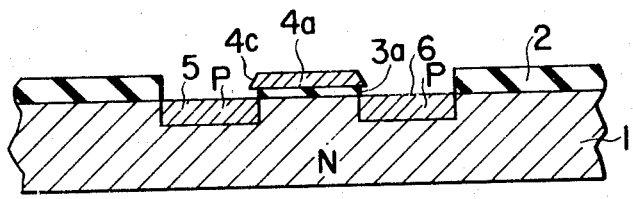
Figure 1G:
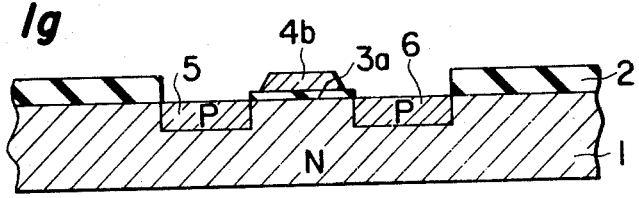
Figure 1H:
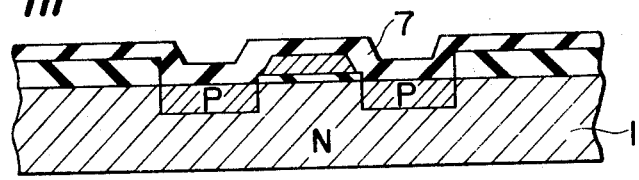
Figure 1I:
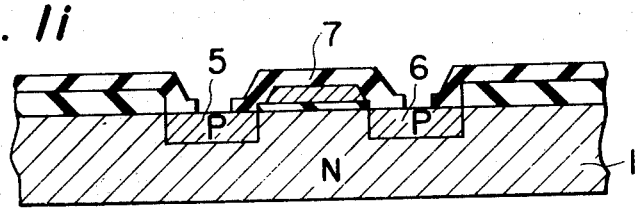
Figure 1J:
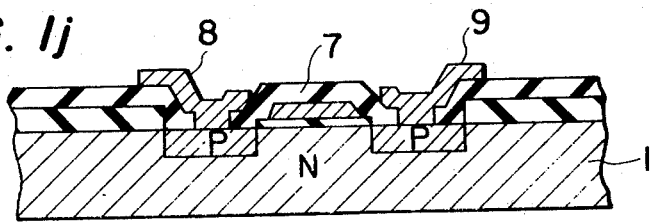

The present invention will be concretely described hereunder in connection with the preferred embodiments thereof.

FIGS. 1a to 1j illustrate the steps of manufacture in an example in which the present invention is applied to a p-channel silicon gate MIS field-effect transistor.

a. An n-type signal crystal silicon substrate 1 (crystal face (1 1 1), $\rho_{SB} = 5 - 8\Omega\cdot cm$) is prepared. It is subjected to surface oxidation in water vapor at about 1,200°C for 2½ hours, to form a silicon oxide film 2 to a thickness of about 14,000 A.

b. A known photoetching treatment is carried out, to remove that part of the oxide film 2 which corresponds to active regions to-be-formed and to thus expose a part of the substrate.

c. The resultant substrate is heated in dried oxygen at about 1,200°C for about 20 minutes, to form a gate oxide film 3 (about 1,100 A thick) at the exposed part of the silicon substrate.

d. Silicon, produced by thermally decomposing about 4% monosilane ($SiH_4$) in nitrogen at about 600°C, is deposited on the entire surface of the substrate, to form a non-doped, or substantially intrinsic polycrystalline silicon layer 4 (about 6,000 – 6,500 A thick).

e. Except for parts corresponding to a gate portion, the oxide film 3 and the polycrystalline silicon layer 4 are removed by photoetching. In this case, the liquid etchant used for the silicon layer 4 is a mixed solution which is well known and which consists of fluoric acid, nitric acid and acetic acid. That used for the oxide film 3 is a mixed solution consisting of fluoric acid and ammonium fluoride. Thus, the gate portion having a pend roof 4c at each side edge and made up of the silicon layer 4a and the oxide film 3a is formed.

f. Using the gate portion 3a, 4a as a mask, boron (B) is diffused into the silicon substrate, to form a source 5 and a drain 6 of the p-type in the substrate. The depth of the diffused layer is about 8,000 A.

Next, the resultant substrate 1 is heated in wet oxygen at about 940°C for several minutes, to lightly oxidize the surface of the silicon layer 4a. Silicon layer 4a has a thickness in the range from about 4,000 A to about 6,000 A which is varied in accordance with its required resistivity, since the silicon layer is used as an interconnection layer as well as a gate electrode. Thereafter, the surface oxide is subjected to light etching for several tens of seconds by the use of a liquid etchant consisting of fluoric acid and ammonium fluoride. The make up of the etchant may be a mixture of 1 part of 50% fluoric acid and 6 parts of 50% ammonium fluoride by volume. The etching depth is several hundred A.

g. Here, etching for removing the pent roof 4c at each side edge of the silicon layer 4a of the gate is effected. Namely, an etchant consisting of 1 part fluoric acid, 30 parts nitric acid, and 40 parts of acetic acid is applied to the structure for 10 to 20 seconds. As a result, 500 to 1,000 A of the layer 4a is etched. Thus, the gate is formed into a silicon layer 4b which is free from the side edge projections.

Subsequently, the second light oxidation is performed in damp oxygen at about 940°C. The thickness of the oxide film formed (at 10 in FIG. 2) is about several hundred A.

h. A phospho-silicate-glass layer produced through the reaction of monosilane ($SiH_4$) and phosphorus hydride ($PH_3$) in nitrogen and oxygen at about 450°C, that is, a so-called PSG layer 7 is deposited over the entire surface. The thickness of the PSG layer 7 is about 8,000 – 10,000 A. Thereafter, the resultant substrate is annealed at about 1,050°C for several tens of minutes. Instead of the PSG layer, a silicon oxide layer by the chemical vapor reaction process (a CVD oxide layer) may be used.

i. Contact photoetching is carried out for forming electrodes of the source and drain.

j. Aluminum is evaporated to a thickness of about 1.8$\mu$ over the entire surface. Unnecessary parts of the aluminum layer are removed in conformity with a predetermined electrode pattern. Then, the aluminum electrodes 8 and 9 respectively connected to the source 5 and drain 6 are left and formed.

Figure 2:
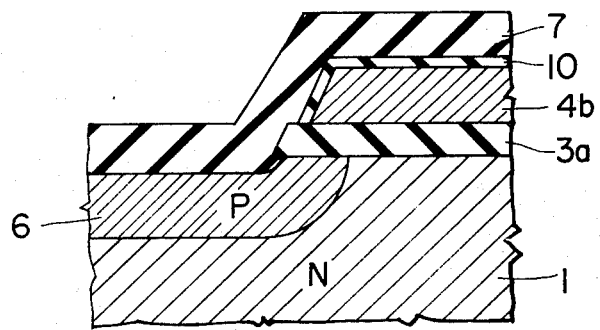
FIG. 2 is a vertical sectional view of essential portions of the MIS structure at the final step of the embodiment in FIG. 1.
Figure 3:
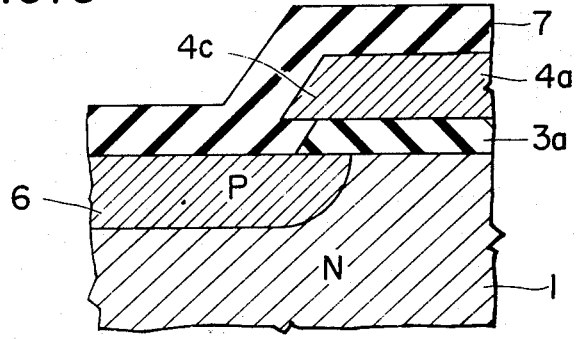
FIG. 3 is a vertical sectional view of the corresponding essential portions at the final step of a prior-art method.

FIG. 2 shows on enlarged scale the vicinity of the gate of the transistor produced by the method stated above. The side edge part of the silicon layer 4b of the gate recedes to over the oxide film 3a. The "pent roof" 4c at the side edge part in the prior-art case, shown in FIG. 3 in contrast to FIG. 2, has disappeared. When the gate is formed in this manner, the local hanging of the pent roof 4c at the side edge and the electric field concentration are eliminated, and the gate destruction is preventable.

If gate destruction is prevented from occuring (below 0.1%), almost no defective device will arise due to the voltage screening test, and the test stage will be unnecessary. This is advantageous in reducing the number of the steps of manufacturing process.

Figure 4:
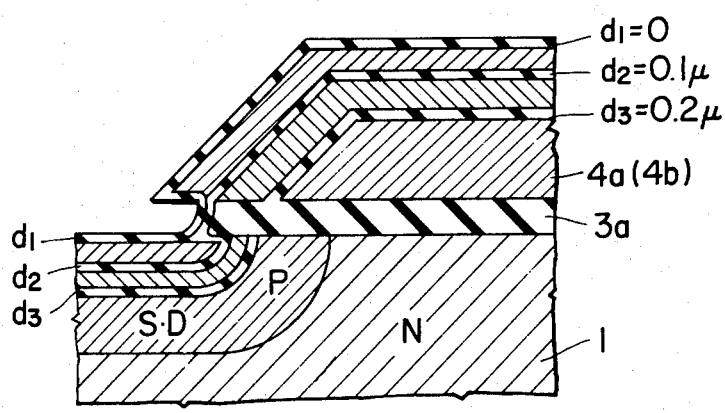
FIGS. 4 to 7 are vertical sectional views of the essential portions, showing various aspects of etching depths according to further embodiments of the present invention.

FIG. 4 illustrates, in comparison, the respective profiles of the surfaces of the silicon layer 4 and the diffused layer S, D at the etching depths of $d_1 = 0$, $d_2 = 0.1\mu$ and $d_3 = 0.2\mu$ in the case where, as described in the embodiment, the pent roof 4c at each side edge of the polycrystalline silicon layer of the gate is etched after the diffusion of the source and drain, whereupon a slight oxidation is carried out.

Even if only the etching of the pent roof 4c is effected after the diffusion of the source and drain and the treatment by slight oxidation is not conducted, the gate destruction can be prevented.

Figure 5:
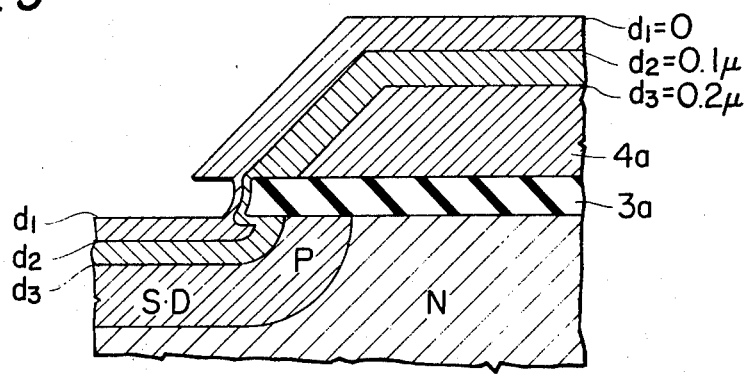

FIG. 5 illustrates the profiles of the surfaces of the silicon layer and the diffused layer at the various etching depths in the case where, as described just above, only the etching of the pent roof is carried out after the diffusion of the source and drain.

Even when performed before the diffusion of the source and drain, namely, after the photo etching step for exposing the source and drain parts of the substrate, the etching of the pent roof at each side edge of the silicon layer of the gate is effective to prevent destruction. In this case, boron is doped into the oxide film by the subsequent diffusing step for the source and drain. At the step of removing glass which contains boron oxide, a part of each side edge of the oxide film is removed at the same time, and a new and small pent roof (at 4d in FIG. 6 and FIG. 7) is formed. As a result, satisfactory prevention of the gate destruction is not attained. However, if slight oxidation is performed thereafter, gate destruction can be lessened.

Figure 6:
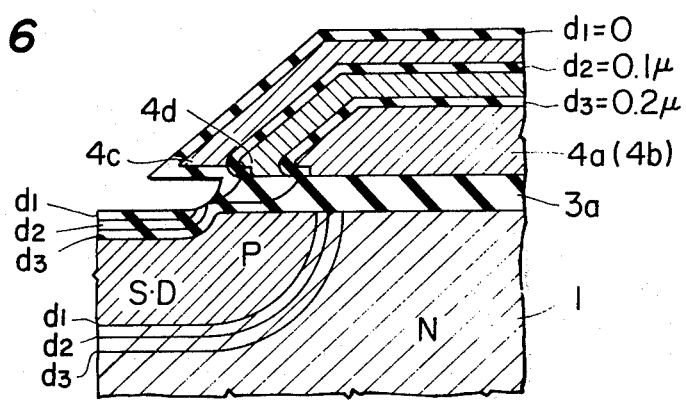

FIG. 6 illustrates the profiles of the silicon layer at the various etching depths in the case where the pent roof is etched after the photoetching for exposing the source and drain parts, whereupon the etched pent roof is lightly oxidized.

Figure 7:
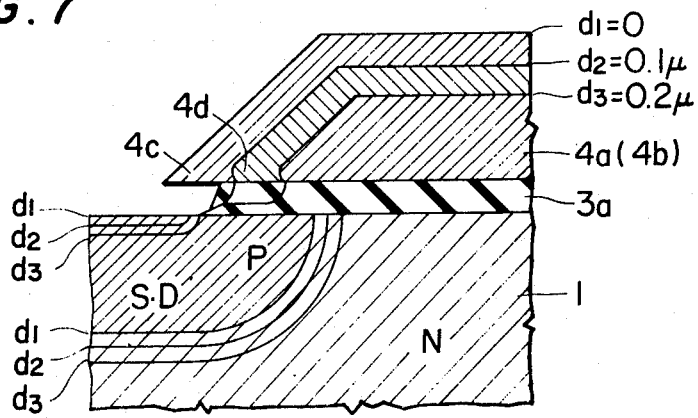

FIG. 7 corresponds to the case where the light oxidation is not conducted in the case of FIG. 6.

In these cases, the substrate surface is subjected to the diffusion after the etching of the pent roof, so that the state of the junctions varies in dependence on the etching depth.

Figure 8:
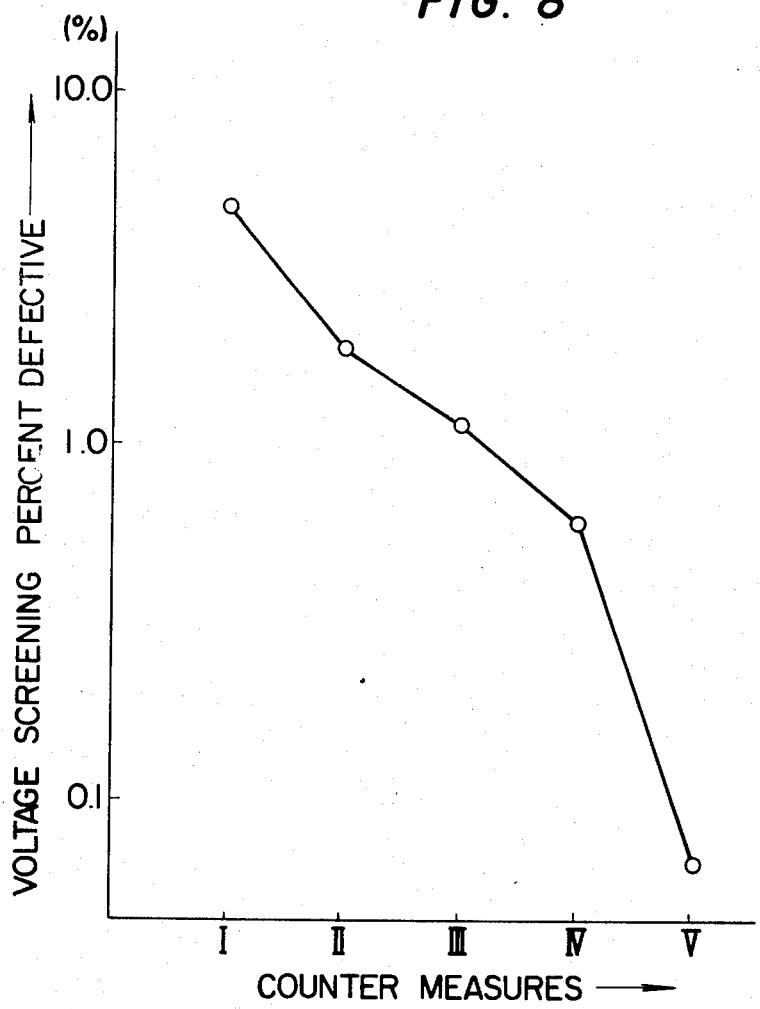
FIG. 8 is a curve diagram showing the relationship between a variety of countermeasures for realizing the present invention and the changes of percent defective.

FIG. 8 illustrates the relationship between the various counter-measures for preventing the gate destruction and the voltage screening percent defective.

The present invention is applicable to all forms of MIS (conductor layer-insulator-semiconductor) structures having self-alignment construction, for example, MIS transistors, MIS diodes, MIS ICs and MIS LSIs. As the conductor layer, a metal such as molybdenum is similarly applicable in addition to the polycrystalline silicon. As the insulting film, a film of silicon nitride ($Si_3N_4$) or a laminated film of silicon oxide and silicon nitride is applicable in addition to the silicon oxide film.

While we have shown and described several embodiments in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What we claim is:

1. In a method of manufacturing a silicon gate MOS field-effect transistor wherein an oxide film is thermally formed on a silicon substrate, a polycrystalline silicon layer is formed on said oxide film, parts of said oxide film and said polycrystalline silicon layer are etched to form a gate and simultaneously expose parts of said substrate, pent roof portions of the polycrystalline silicon layer extending over said oxide film being formed as a result of the etching of parts of said oxide film and said polycrystalline silicon layer, and impurities are doped into said substrate with said gate used as a mask to thereby form a source and a drain, the improvement comprising the step of:
completely removing said pent roof portions of said polycrystalline silicon layer resulting from the etching of said oxide film and said polycrystalline silicon layer by etching a surface of said polycrystalline silicon layer after the formation of said gate or after the doping of said impurities by the use of a liquid etchant whose etching rate is larger for said polycrystalline silicon layer than for said oxide film.

2. A method of manufacturing a semiconductor device comprising the steps of:
a. selectively forming a first layer of insulating material on the surface of a semiconductor substrate on a first conductivity type by forming an initial insulating layer on the surface of said substrate, and removing prescribed portions of said initial layer to expose said substrate therebeneath;
b. selectively forming a second layer of material which is at least semiconductive on said initial layer and removing prescribed portions of said second layer over said prescribed portions of said initial layer, while partially overlapping said prescribed portions of said initial layer, so that said second layer does not extend over the side edge of said initial layer; and
c. introducing impurities of a second conductivity type, opposite said first conductivity type into the exposed portions of said substrate to form respective semiconductor regions of said second conductivity type therein which extend to the surface of said substrate; and
wherein said step (b) further comprises the step of etching both said initial insulating layer and said second layer with a liquid etchant whose etching rate for said second layer is greater than its etching rate for said initial layer, subsequent to step (c) of introducing impurities.

3. A method according to claim 2, wherein said initial layer is a layer of polycrystalline silicon.

4. A method according to claim 2, wherein said initial layer is a layer of molybdenum.

5. A method of manufacturing a field effect transistor comprising the steps of:
a. forming an insulating film on a major surface of a semiconductor body of a first conductivity type;
b. selectively forming a conductive film to be used as a gate electrode of said transistor on said insulating layer;
c. selectively etching said insulating film to partially expose surface portions of said major surface of said body by using a first etchant whose etching rate for said insulating film is greater than its etching rate for said conductive film, thereby forming pent roof portions of said conductive film which project laterally beyond the underlying insulating film;
d. forming a pair of semiconductor regions of a second conductivity type in said semiconductor body by introducing an impurity through said exposed surface portions employing said conductive film and the remaining insulating film as a mask; and
e. partially removing prescribed portions of said conductive film by using a second etchant whose etching rate for said conductive film is greater than its etching rate for said insulating film, so that said pent roof portions of said conductive film are completely removed.

6. A method according to claim 5, wherein said semiconductor body is silicon, said insulating film is silicon oxide, and said conductive film is one selected from the group of silicon and molybdenum.

* * * * *